(12) United States Patent
Lin et al.

(10) Patent No.: US 9,847,399 B1
(45) Date of Patent: Dec. 19, 2017

(54) SEMICONDUCTOR DEVICE AND A METHOD FOR FABRICATING THE SAME

(71) Applicant: TAIWAN SEMICONDUCTOR MANUFACTURING CO., LTD., Hsinchu (TW)

(72) Inventors: Meng-Han Lin, Hsinchu (TW); Chih-Ren Hsieh, Changhua (TW); Chen-Chin Liu, Hsinchu (TW); Zhen Yang, Hsinchu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 0 days.

(21) Appl. No.: 15/216,565

(22) Filed: Jul. 21, 2016

(51) Int. Cl.
| | | |
|---|---|---|
| *H01L 27/088* | (2006.01) | |
| *H01L 29/423* | (2006.01) | |
| *H01L 21/8234* | (2006.01) | |
| *H01L 29/06* | (2006.01) | |
| *H01L 21/28* | (2006.01) | |

(52) U.S. Cl.
CPC .. *H01L 29/42368* (2013.01); *H01L 21/28185* (2013.01); *H01L 21/823462* (2013.01); *H01L 21/823481* (2013.01); *H01L 27/088* (2013.01); *H01L 29/0649* (2013.01)

(58) Field of Classification Search
CPC ....... H01L 21/28185; H01L 21/823462; H01L 21/823481; H01L 29/28185; H01L 29/0649; H01L 29/42368; H01L 27/088
See application file for complete search history.

(56) References Cited

U.S. PATENT DOCUMENTS

| | | | | |
|---|---|---|---|---|
| 2012/0001259 A1* | 1/2012 | Chuang | ............. | H01L 21/82345 257/331 |
| 2015/0097252 A1* | 4/2015 | Flachowsky | .......... | H01L 29/517 257/410 |

* cited by examiner

*Primary Examiner* — Marcos D Pizarro
*Assistant Examiner* — Long H Le
(74) *Attorney, Agent, or Firm* — McDermott Will & Emery LLP

(57) ABSTRACT

In a method of manufacturing a semiconductor device, an isolation region is formed in a substrate. The isolation region surrounds an active region of the substrate in plan view and includes an insulating material. A first dielectric layer is formed over the active region. A mask layer is formed on at least a part of a border line between the isolation region and the active region. The mask layer covers a part, but not entirety, of the first dielectric layer and a part of the isolation region surrounding the active region. The first dielectric layer not covered by the mask layer is removed such that a part of the active region is exposed. After the first dielectric layer is removed, the mask layer is removed. A second dielectric layer is formed so that a gate dielectric layer is formed. A gate electrode is formed over the gate dielectric layer.

20 Claims, 15 Drawing Sheets

US 9,847,399 B1

SEMICONDUCTOR DEVICE AND A METHOD FOR FABRICATING THE SAME

TECHNICAL FIELD

The disclosure relates to a method for manufacturing a semiconductor device, and more particularly to field effect transistor (FETs) having different gate dielectric thicknesses and a manufacturing method therefor.

BACKGROUND

Some semiconductor device such as an embedded flash memory, a high-voltage FET, and bipolar-CMOS-DMOS devices require formation of multiple gate dielectric (gate oxide) layers having different thicknesses. The process for manufacturing multiple gate dielectric (gate oxide) layers includes multiple formations of gate dielectric layers and removal of at least one formed gate dielectric layer. A process that does not affect FET properties has been requested.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

DETAILED DESCRIPTION

It is to be understood that the following disclosure provides many different embodiments, or examples, for implementing different features of the invention. Specific embodiments or examples of components and arrangements are described below to simplify the present disclosure. These are, of course, merely examples and are not intended to be limiting. For example, dimensions of elements are not limited to the disclosed range or values, but may depend upon process conditions and/or desired properties of the device. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact. Various features may be arbitrarily drawn in different scales for simplicity and clarity.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The device may be otherwise oriented (rotated 90 degrees or at other orientations) and the spatially relative descriptors used herein may likewise be interpreted accordingly. In addition, the term "made of" may mean either "comp rising" or "consisting of."

FIGS. 1A-7D show exemplary plan views (viewed from the above) and cross sectional views illustrating various stages of the sequential fabrication process of a semiconductor device according to one embodiment of the present disclosure. It is understood that additional operations can be provided before, during, and after processes shown by FIGS. 1A-7D, and some of the operations described below can be replaced or eliminated, for additional embodiments of the method. The order of the operations/processes may be interchangeable.

Figure 1A:
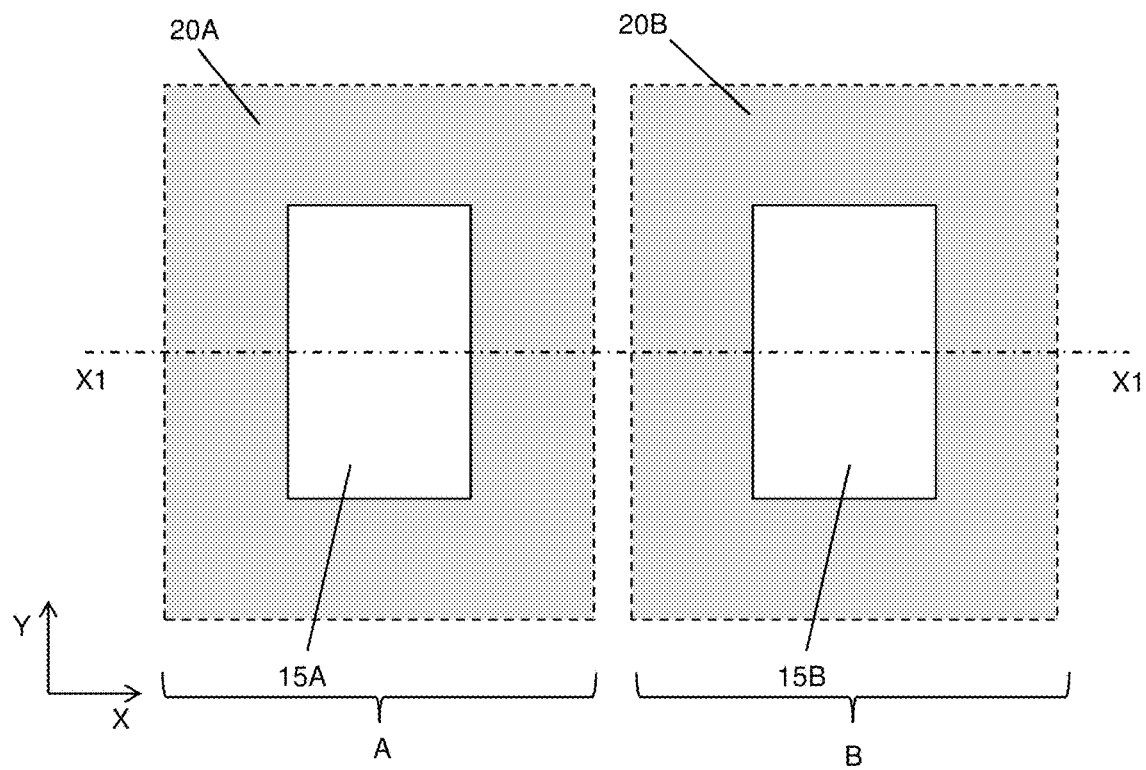
FIGS. 1A-7D shows exemplary plan views (viewed from the above) and cross sectional views illustrating various stages of the sequential fabrication process of a semiconductor device according to one embodiment of the present disclosure.
Figure 1B:
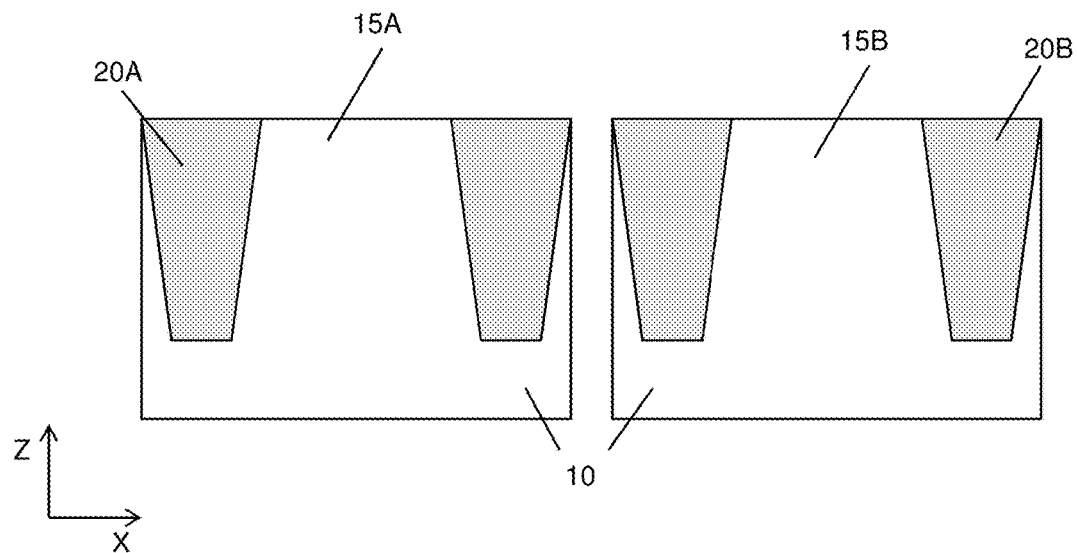
Figure 2A:
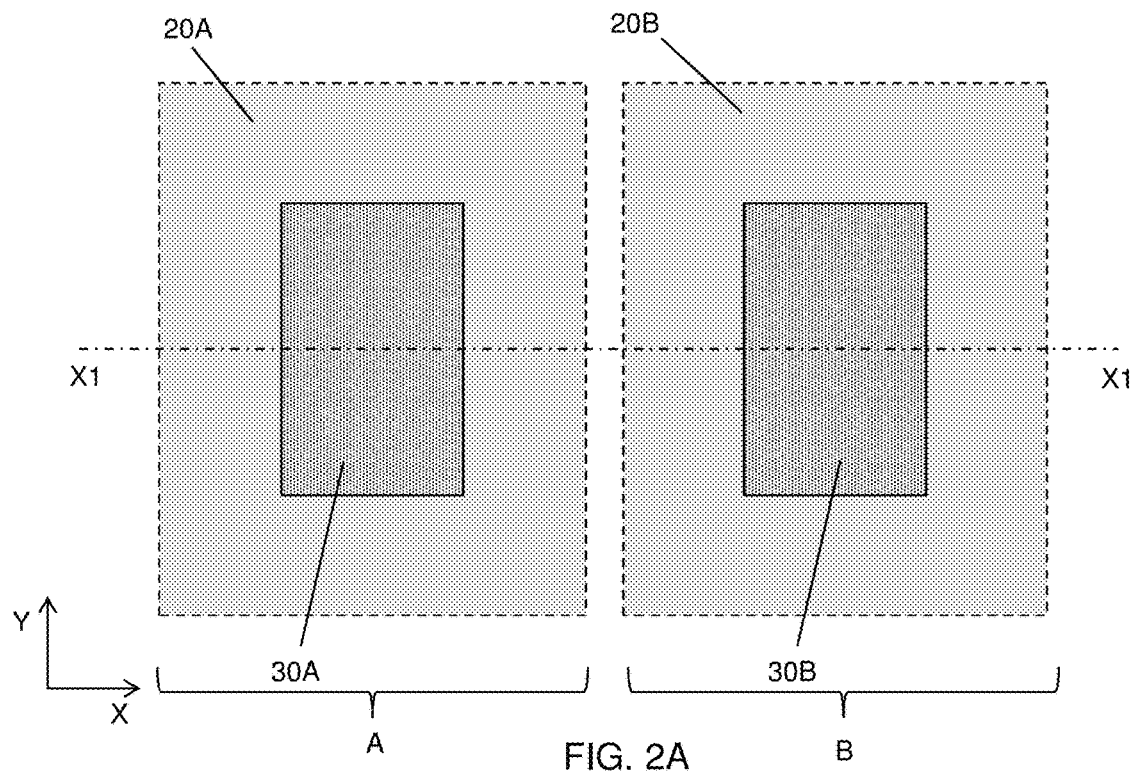
Figure 2B:
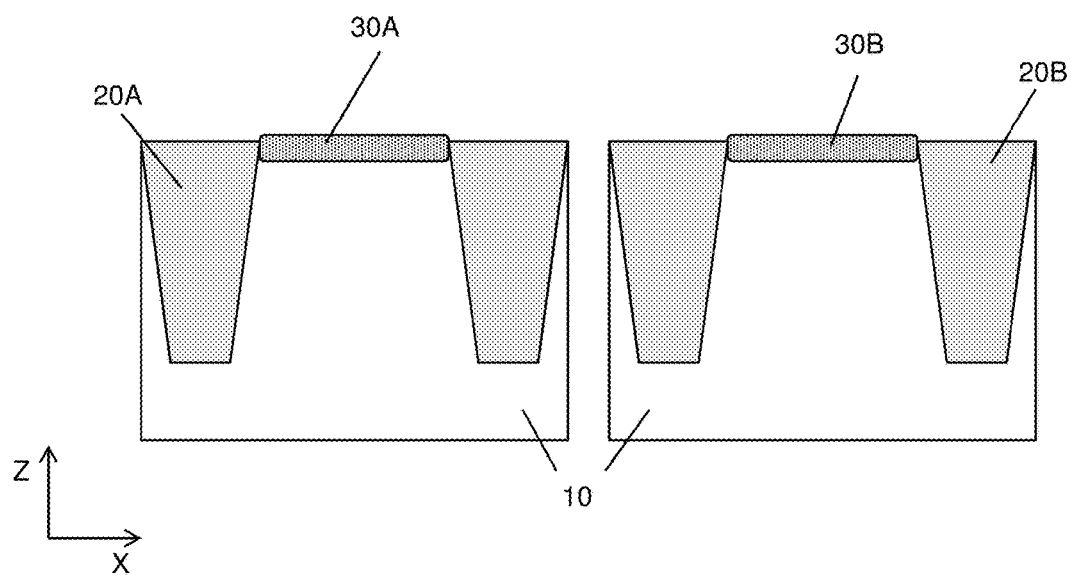

FIG. 1A, 2A, . . . 7A show plan (top) views and FIGS. 1B, 2B, . . . 7B show cross sectional views along line X1-X1 of FIGS. 1A, 2A, . . . 7A, respectively.

In one embodiment of the present disclosure, the semiconductor device includes a first FET formed in a region A and a second FET formed in a region B, as shown in FIGS. 1A and 1B. The regions A and B may be adjacent to each other or may be separated by one or more elements of the semiconductor device. In some embodiments, a gate dielectric layer of the first FET is thicker than a gate dielectric layer of the second FET, and thus a threshold voltage of the first FET is higher than that of the second FET.

FIGS. 1A and 1B show a structure after isolation regions 20A and 20B are formed in a substrate 10. The isolation regions (first isolation region 20A and second isolation region 20B) are also called shallow trench isolation (STI).

The isolation regions 20A and 20B are formed by trench etching the substrate 10 and filling the trenches with an insulating material. The isolation regions are made of, for example, one or more layers of insulating materials such as silicon oxide, silicon oxynitride or silicon nitride, formed by LPCVD (low pressure chemical vapor deposition), plasma-CVD or flowable CVD. In the flowable CVD, flowable dielectric materials instead of silicon oxide are deposited. Flowable dielectric materials, as their name suggest, can "flow" during deposition to fill gaps or spaces with a high aspect ratio. Usually, various chemistries are added to silicon-containing precursors to allow the deposited film to flow. In some embodiments, nitrogen hydride bonds are added. Examples of flowable dielectric precursors, particularly flowable silicon oxide precursors, include a silicate, a siloxane, a methyl silsesquioxane (MSQ), a hydrogen silsesquioxane (HSQ), an MSQ/HSQ, a perhydrosilazane (TCPS), a perhydro-polysilazane (PSZ), a tetraethyl orthosilicate (TEOS), or a silyl-amine, such as trisilylamine (TSA). These flowable silicon oxide materials are formed in a multiple-operation process. After the flowable film is deposited, it is cured and then annealed to remove undesired element(s) to form silicon oxide. When the undesired element(s) is removed, the flowable film densifies and shrinks. In some embodiments, multiple anneal processes are conducted. The flowable film is cured and annealed more than once. The flowable film may be doped with boron and/or phosphorous. The isolation regions may be formed by one or more layers of SOG, SiO, SiON, SiOCN and/or fluorine-doped silicate glass (FSG) in some embodiments.

The substrate 10 is silicon substrate in one embodiment, and is appropriately doped. The substrate 10 may comprise another elementary semiconductor, such as germanium; a compound semiconductor including Group IV-IV compound semiconductors such as SiC and SiGe, III-V compound semiconductors such as GaAs, GaP, GaN, InP, InAs, InSb, GaAsP, AlGaN, AlInAs, AlGaAs, GaInAs, GaInP, and/or GaInAsP; or combinations thereof.

Portions of the substrate surrounded by the isolation regions 20A and 20B are referred to as active regions 15A and 15B, respectively, in which a channel, a source and a drain of an FET are formed.

In FIGS. 2A and 2B, a first dielectric layer 30A is formed over the first active region 15A and a second dielectric layer 30B is formed over the second active region 15B. The first and second dielectric layers are formed at the same time. In one embodiment, the first and second dielectric layers are silicon dioxide which is formed by thermal oxidation. In other embodiments, the first and second dielectric layers are silicon oxide, silicon nitride and/or silicon oxynitride formed by chemical vapor deposition (CVD). A thickness of the first and second dielectric layers is in a range from about 1 nm to about 200 nm in some embodiments.

Figure 3A:
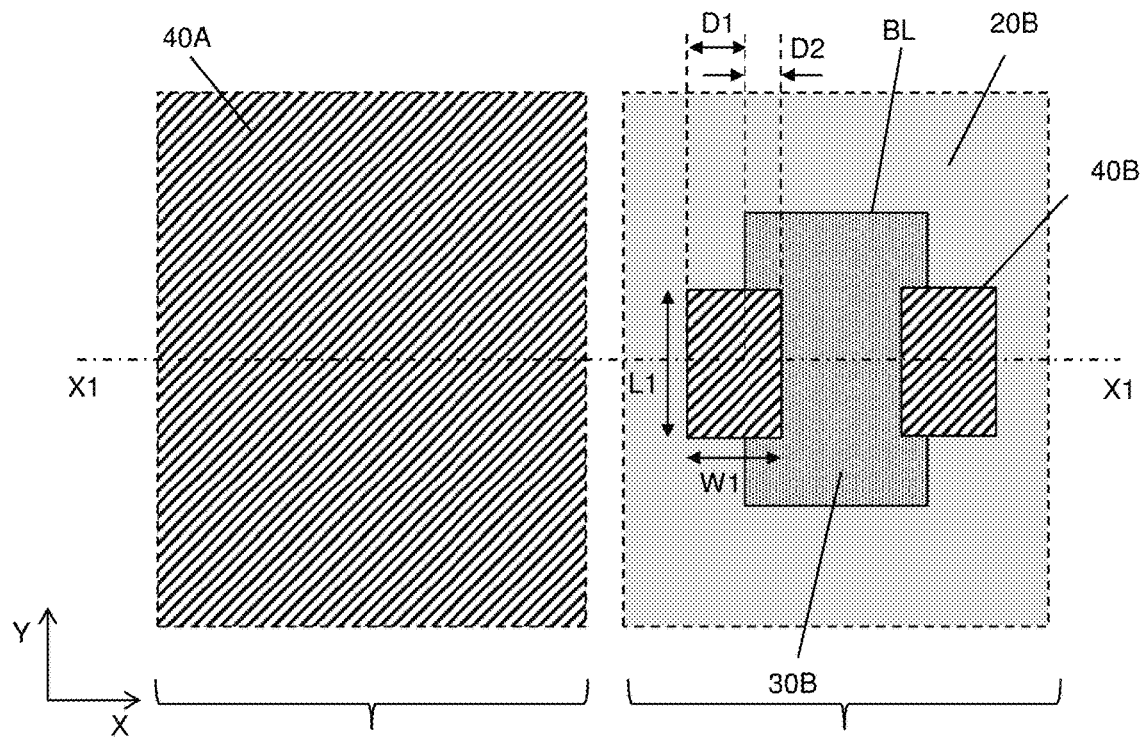
Figure 3B:
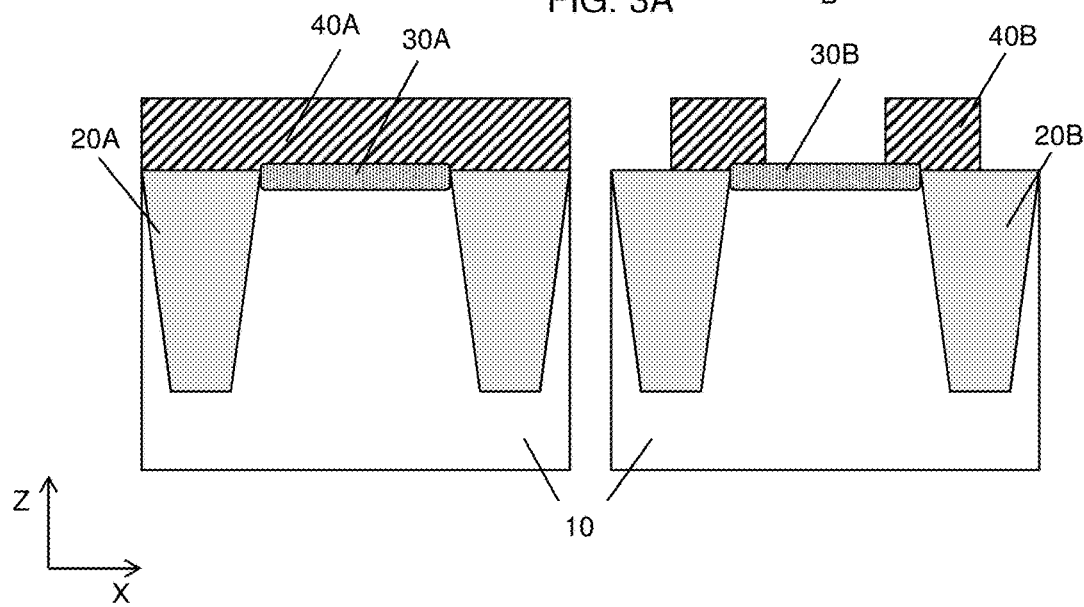

In FIGS. 3A and 3B, a mask layer is formed over the regions A and B. The mask layer is a photo resist pattern formed by a lithography operation. The masks layer includes a first mask layer 40A formed in the region A and a second mask layer 40B formed in the region B. The first mask layer 40A is formed over the first active region 15A to entirely cover the first active region 15A and to cover a portion of the isolation region 20A surrounding the first active region 15A. The second mask layer 40B is formed on at least a part of a border line BL between the isolation region 20B and the second active region 15B. The second mask layer 40B covers a part, but not the entirety, of the second dielectric layer 30B formed on the second active region 15B and covers a part of the isolation region 20B surrounding the second active region 15B.

As shown in the later figures, a gate electrode extends in the X direction of the figures. The second mask layer 40B covers at least parts of the border line BL extending in the Y direction, as shown in FIG. 3A. The dimension L1 of the second mask layer 40B in the Y direction is equal to or greater than a dimension of the gate electrode in the Y direction. In some embodiments, L1 is 1 to 2 times the dimension of the gate electrode in the Y direction. In certain embodiments, the dimension L1 of the second mask layer 40B in the Y direction is smaller than the dimension of the gate electrode in the Y direction Further, as shown in FIG. 3A, an area of the second mask layer 40B that covers the isolation region 20B is greater than an area of the mask layer 40B that covers the second dielectric layer 30B formed on the active region 15B. In other words, when the second mask layer 40B has a rectangular shape (L1×W1), the length D1 of the second mask layer over the second isolation region 20B is greater than the length D2 of the second mask layer over the second dielectric layer 30B, as shown in FIG. 3A. In some embodiments, D1+D2 is set equal to or a slightly greater than an alignment margin allowed in the lithography operation for forming the mask layer. It is noted that D2 may vary depending on the lateral etching bias in the following removal of dielectric layer 30B.

Although in FIGS. 3A and 3B, the region A is entirely covered by the mask layer 40A. However, the isolation region 20A may partially be exposed from the mask layer 40A.

Figure 4A:
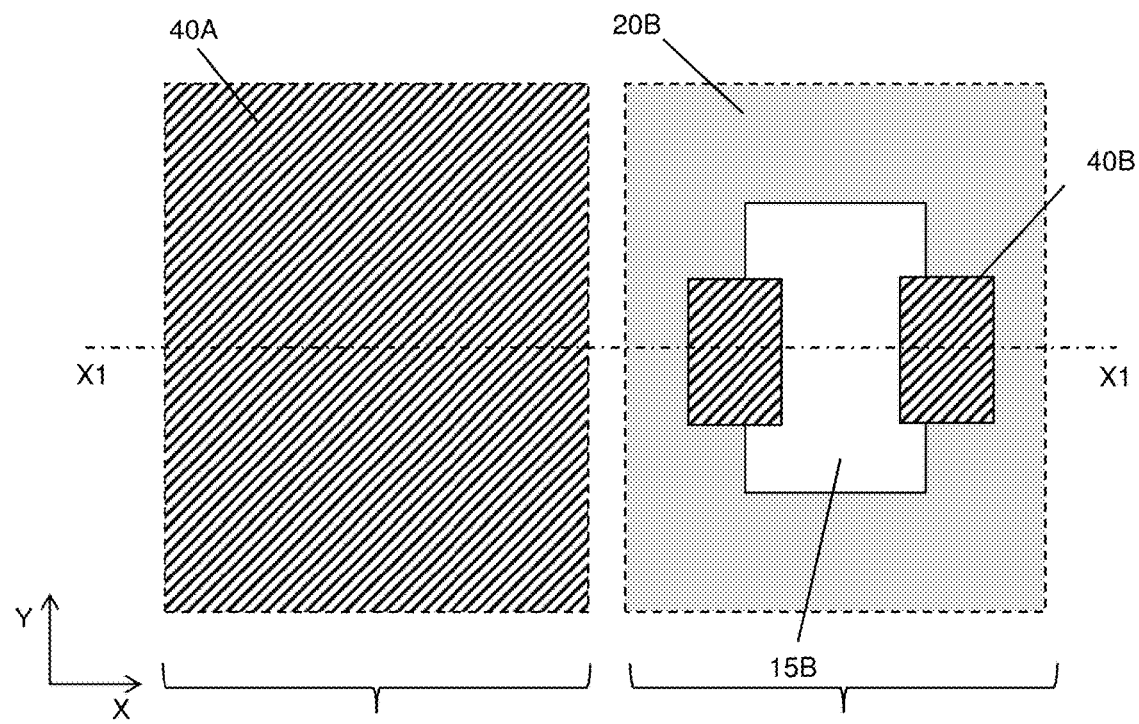
Figure 4B:
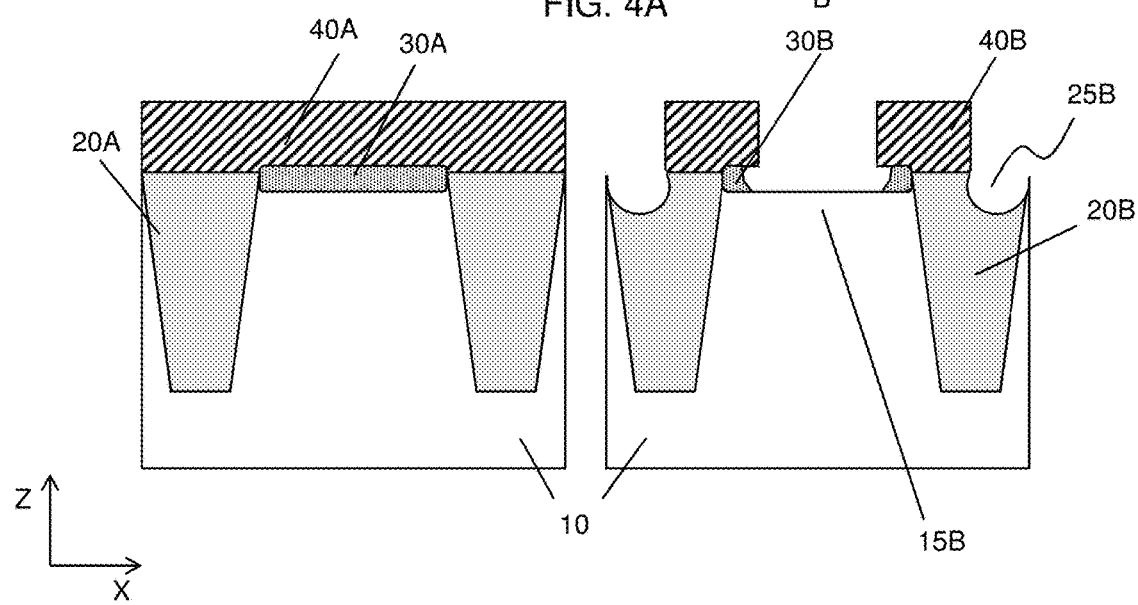

As shown in FIGS. 4A and 4B, the second dielectric layer 30B not covered by the mask layer 40B is removed by using, for example, wet etching and/or dry etching. In one embodiment, wet etching with buffered HF or dilute HF is used. As shown in FIG. 4B, the second active region 15B not covered by the mask layer 40B is exposed. Parts of the second dielectric layer 30B located under the mask layer 40B are partially etched but some parts remain under the mask layer 40B as shown in FIG. 4B.

Further, as shown in FIG. 4B, the isolation region 20B not covered by the mask layer 40B is also etched to form a divot or a recess 25B. The isolation region 20B covered by the mask layer 40B is not etched. The first dielectric layer 30A and the isolation region 20A in the region A are not etched.

Figure 5A:
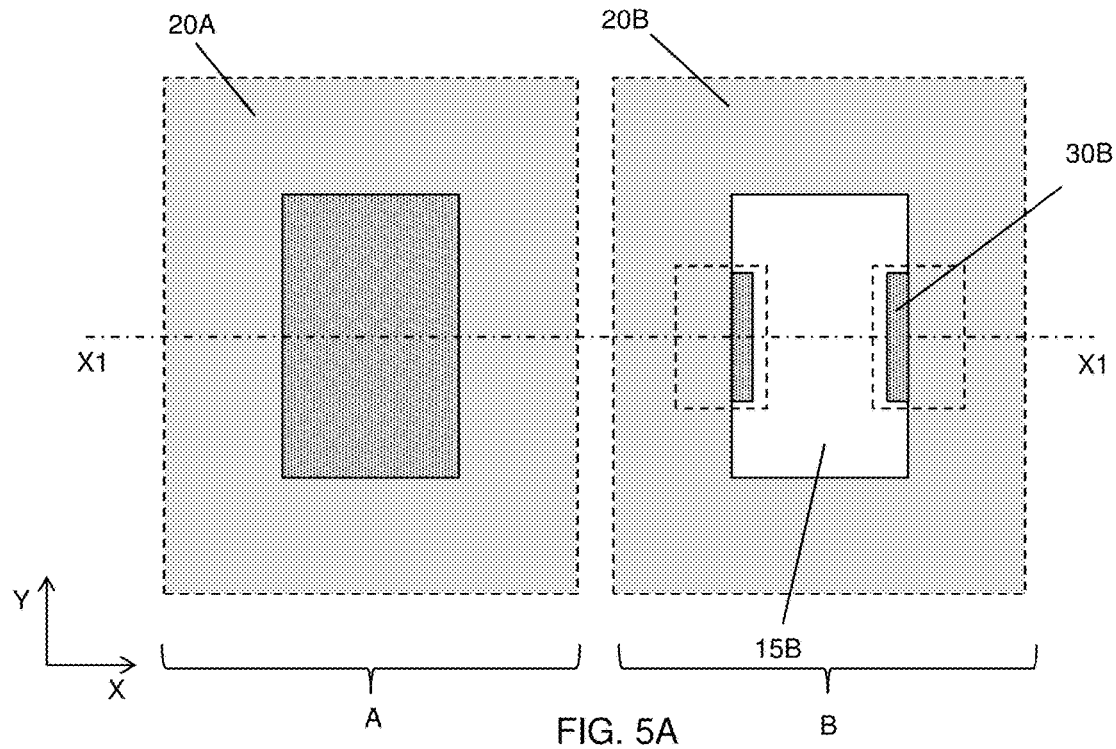
Figure 5B:
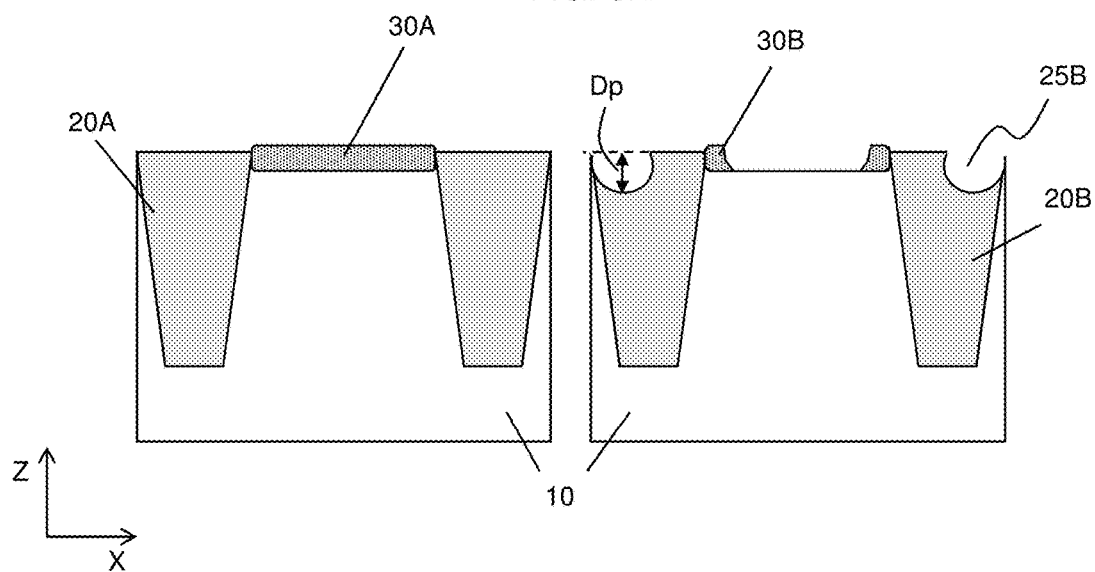

After the etching, the mask layers 40A and 40B are removed by, for example, ashing and cleaning operations, as shown in FIGS. 5A and 5B. Here, a bottom of the divot 25B formed in the isolation region 20B is located below a level of the interface between the second dielectric layer 30B and the active region 15B because an etching rate for the isolation region 20B is greater than an etching rate for the second dielectric layer 30B in the etching operation. In some embodiments, a depth of the divot 25B is in a range of about 1 nm to about 100 nm.

Figure 6A:
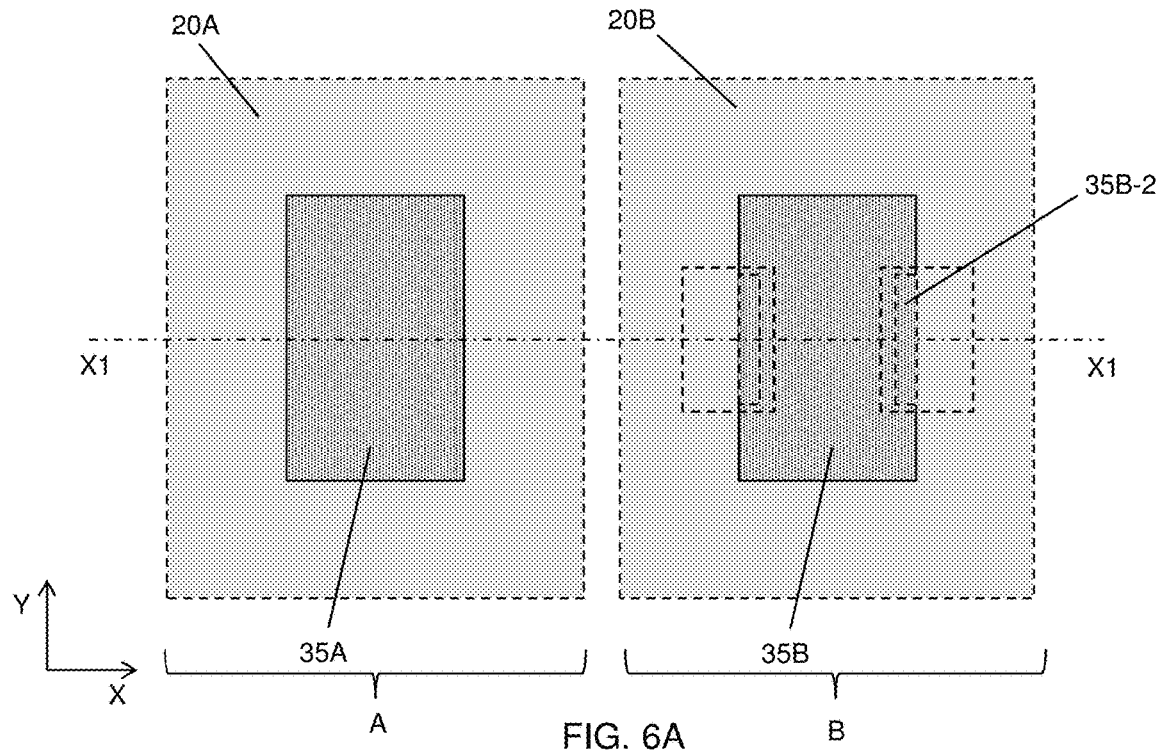
Figure 6B:
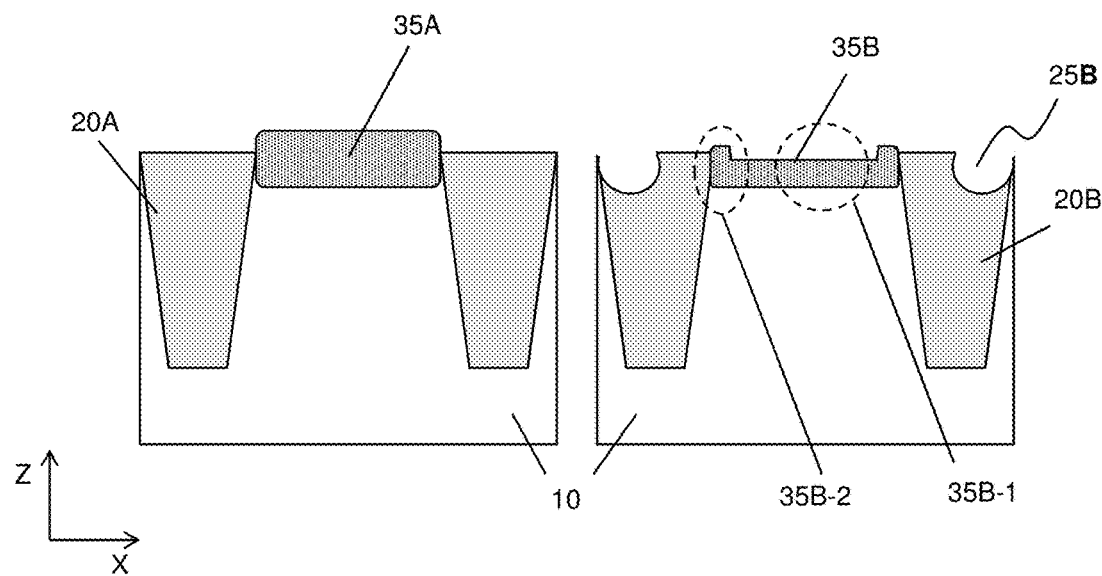

Subsequently, an additional dielectric layer is formed over the first region A and the second region B, thereby forming a first gate dielectric layer 35A and a second gate dielectric layer 35B, as shown in FIGS. 6A and 6B. In one embodiment, the additional dielectric layer is silicon dioxide which is formed by thermal oxidation. In other embodiments, the additional dielectric layer is silicon oxide, silicon nitride and/or silicon oxynitride formed by chemical vapor deposition (CVD).

As shown in FIGS. 6A and 6B, by the additional thermal oxidation, the thickness of the first gate dielectric layer 35A can be formed thicker than the first dielectric layer 30A. Further, in the second region B, the exposed surface of the second active region 15B is oxidized, thereby forming the second gate dielectric layer 35B. Since parts of the second dielectric layer 30B remain at the edge of the second active region 15B, the second gate dielectric layer 35B includes a first region 35B-1 and a second region 35B-2 having a thickness greater than the first region 35B-1. The thickness of the first region 35B-1 is in a range from about 1 nm to about 150 nm in some embodiments. The thickness of the second region 35B-2 and the thickness of the first gate dielectric layer 35A are substantially the same and are in a range from about 2 nm to about 200 nm, in some embodiments.

Figure 7A:
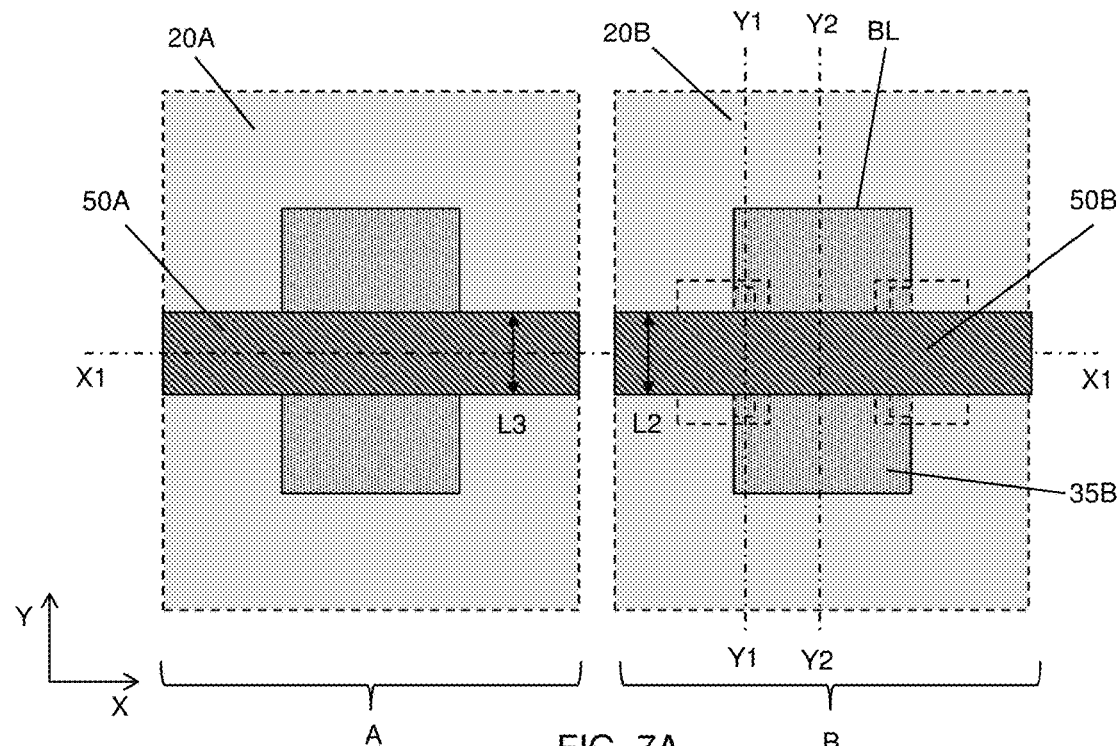
Figure 7B:
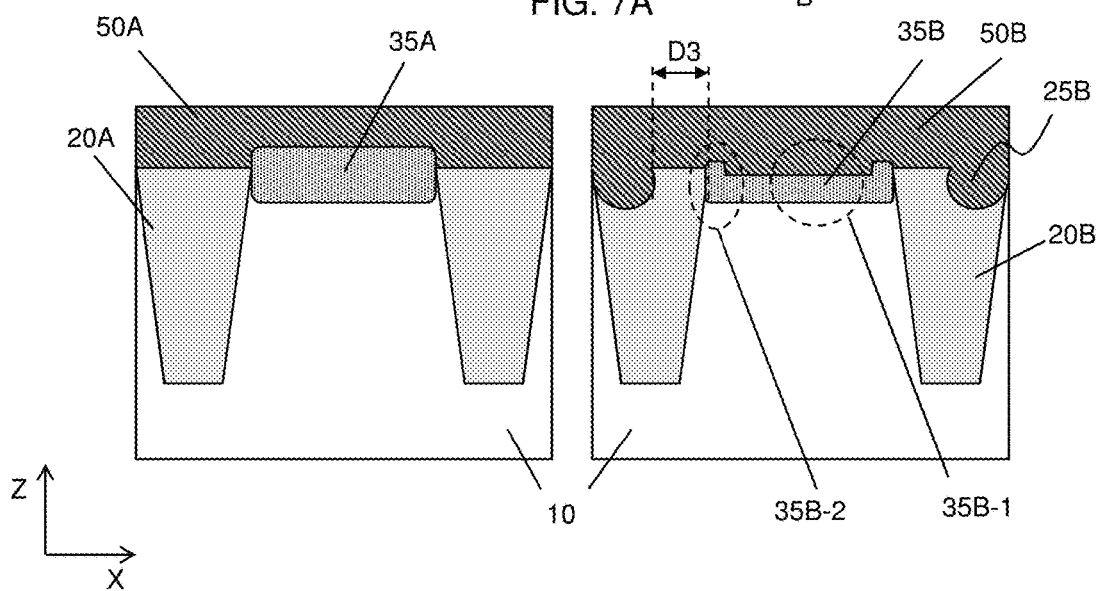

After the gate dielectric layers are formed, a first gate electrode 50A and a second gate electrode 50B are formed as shown in FIGS. 7A and 7B. As shown in FIG. 7A, the first and second gate electrodes extend in the X direction. Of course, at least one of the first and second gate electrodes may extend in the Y direction. The first and second gate electrodes are made of a conductive material, such as a polysilicon and a metal material, and formed by a film deposition operation, a lithography operation and an etching operation.

As set forth above, a width L2 of the second gate electrode 50B is equal to or less than the dimension L1 of the second mask layer 40B (see, FIG. 3B).

Further, as shown in FIG. 7B, the divot 25B is filled with the material (e.g., polysilicon) of the second gate electrode 50B. The filled divot is physically separated and located away from the border line (the closest border line) BL between the isolation region 20B and the second active region 15B. The filled divot is not in contact with the second gate dielectric layer 35B at the level of the interface between the second gate electrode 50B and the second gate dielectric layer 35B. A distance D3 between the edge of the filled divot (closest to the border line BL) and the border line BL is equal to or more than about 5 nm. The upper limit of D3 depends on the circuit design and may range from the order of 100 nm to the order of micro meters, e.g., 5 µm.

Figure 7C:
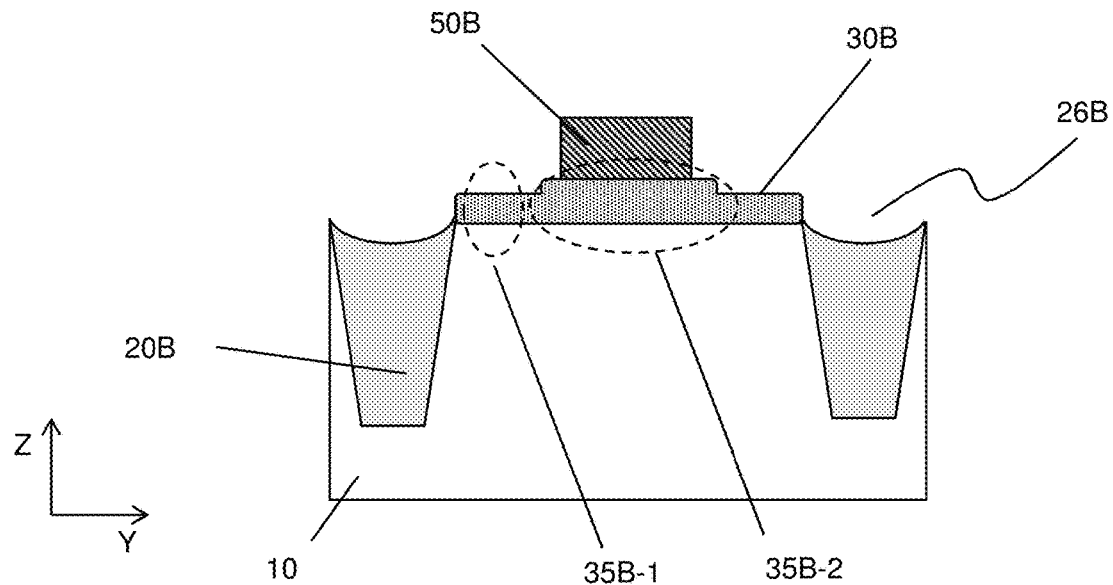
Figure 7D:
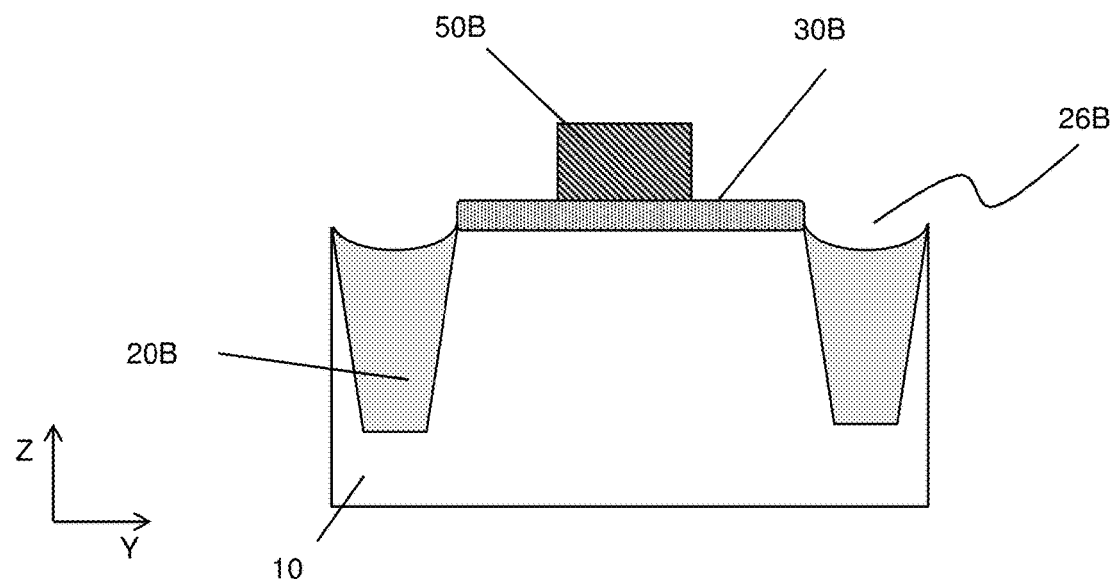

FIGS. 7C and 7D are cross sectional views along line Y1-Y1 and Y2-Y2 of FIG. 7A, respectively. Along the Y direction, divots (recesses) 26B are formed in the isolation region 20B. As shown in FIG. 7C, the width of the second region 35B-2 along the Y direction is equal to or greater than the width of the second gate electrode 50B.

Figure 8:
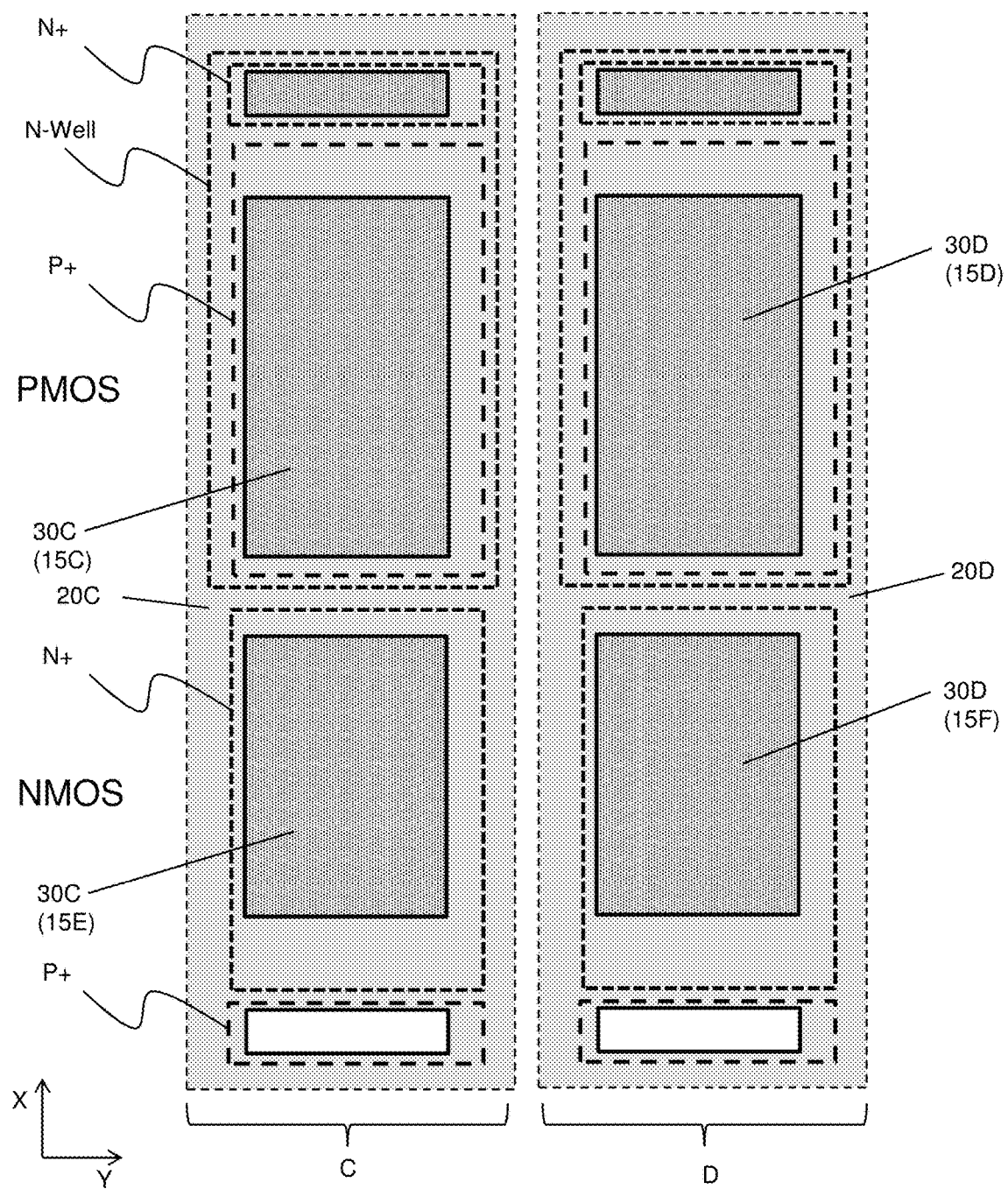
FIGS. 8-10 show exemplary plan views illustrating various stages of the sequential fabrication process of a semiconductor device according to another embodiment of the present disclosure.
Figure 9:
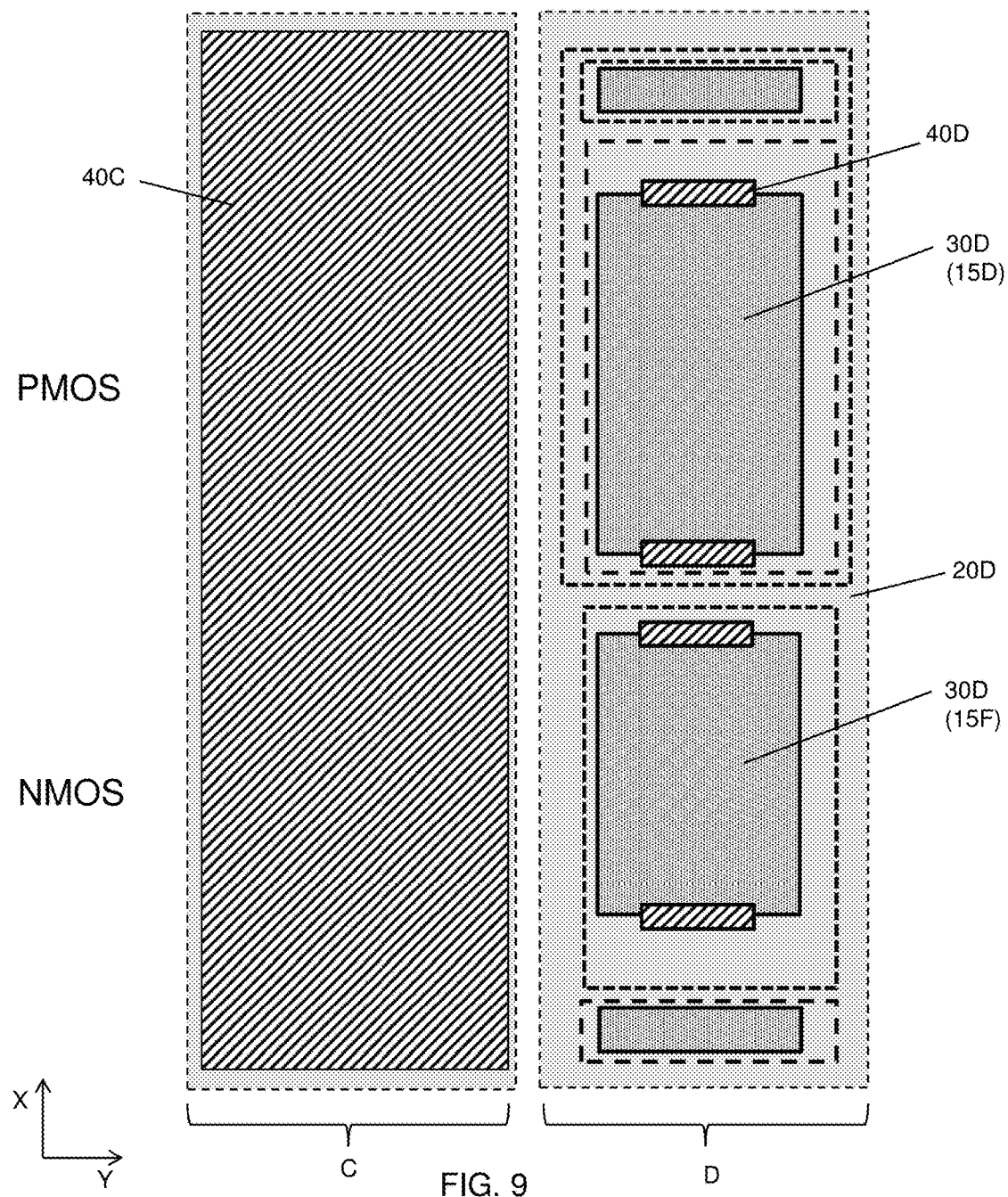
Figure 10:
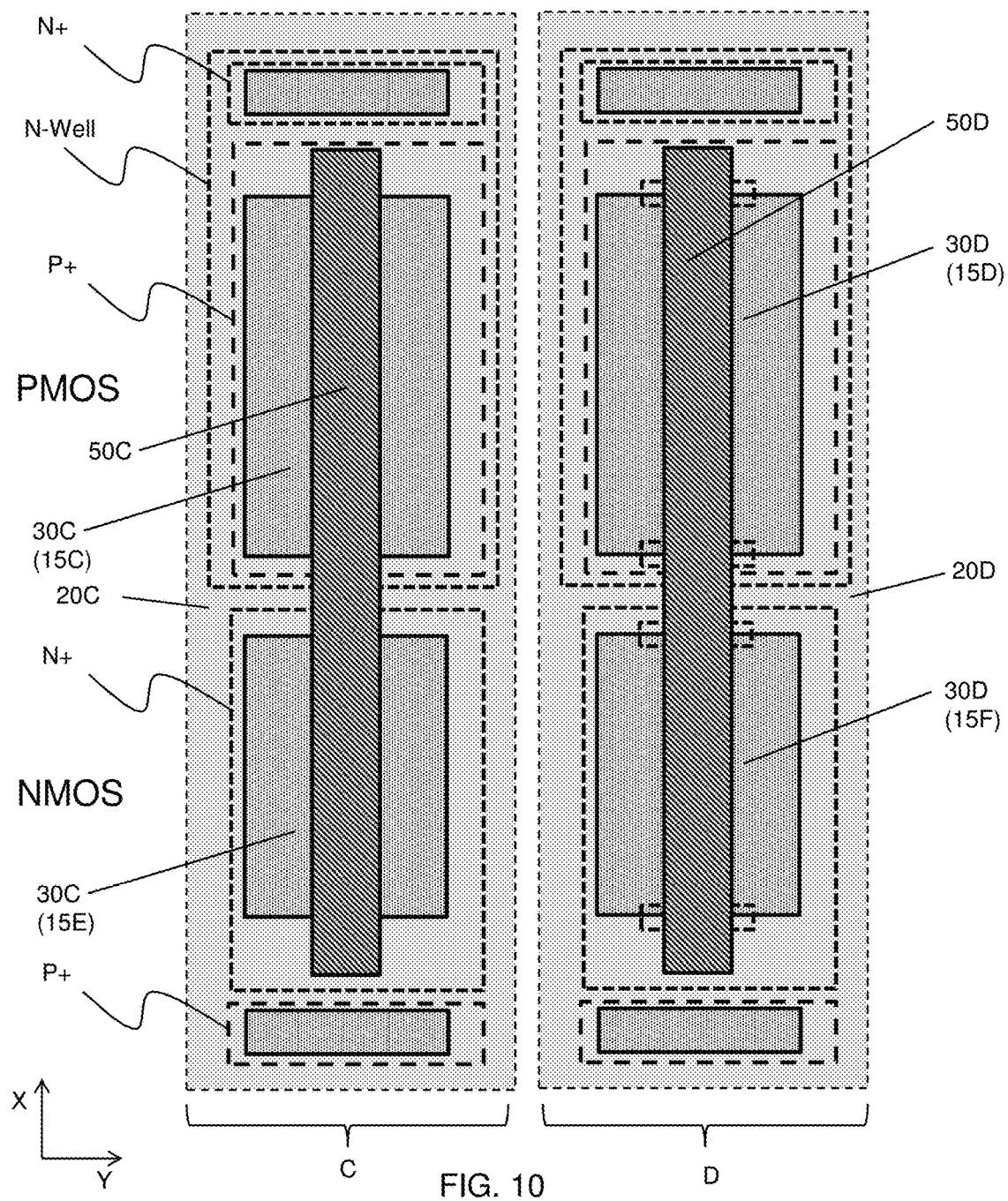

FIGS. 8-10 show exemplary plan views illustrating various stages of the sequential fabrication process of a semiconductor device according to another embodiment of the present disclosure. FIGS. 8-10 show CMOS inverter layouts. The same or similar configurations, operations, processes and/or material as those explained with FIGS. 1A-7D are employed in this embodiment, and the detailed explanation thereof may be omitted.

As shown in FIG. 8, an inverter is formed in a high voltage region C and an inverter is also formed in a low voltage region D. Each of the high and low voltage regions includes a PMOS region and an NMOS region. The PMOS region includes an N-Well and a P+ region and the NMOS region includes a P-Well (not shown) and an N+ region. The PMOS region may also include a N+ region for a substrate contact, and the NMOS region may also include a P+ region for a substrate contact.

Active regions 15C and 15E, surrounded by isolation region 20C, are formed in the PMOS and NMOS regions, respectively, in the high voltage region C, and active regions 15D and 15F, surrounded by isolation region 20D, are formed in the PMOS and NMOS regions, respectively, in the low voltage region D. Further, dielectric layers 30C and 30D are formed in the active regions.

As shown in FIG. 9, the high voltage region C is covered by a mask layer 40C. In the low voltage region D, similar to FIG. 3A, parts of border lines between the active regions and the isolation region 20D are covered by mask layer 40D as shown in FIG. 9.

After the similar operations as those for FIGS. 4A-7D, gate electrodes 50C and 50D are formed, as shown in FIG. 10.

FIG. 11A-12B shows exemplary plan views and cross sectional views illustrating various stages of the sequential fabrication process of a semiconductor device according to another embodiment of the present disclosure. The same or similar configurations, operations, processes and/or material as those explained with FIGS. 1A-10 are employed in this embodiment, and the detailed explanation thereof may be omitted. FIGS. 11A-12B illustrate the manufacturing operations in the second region B.

Figure 11A:
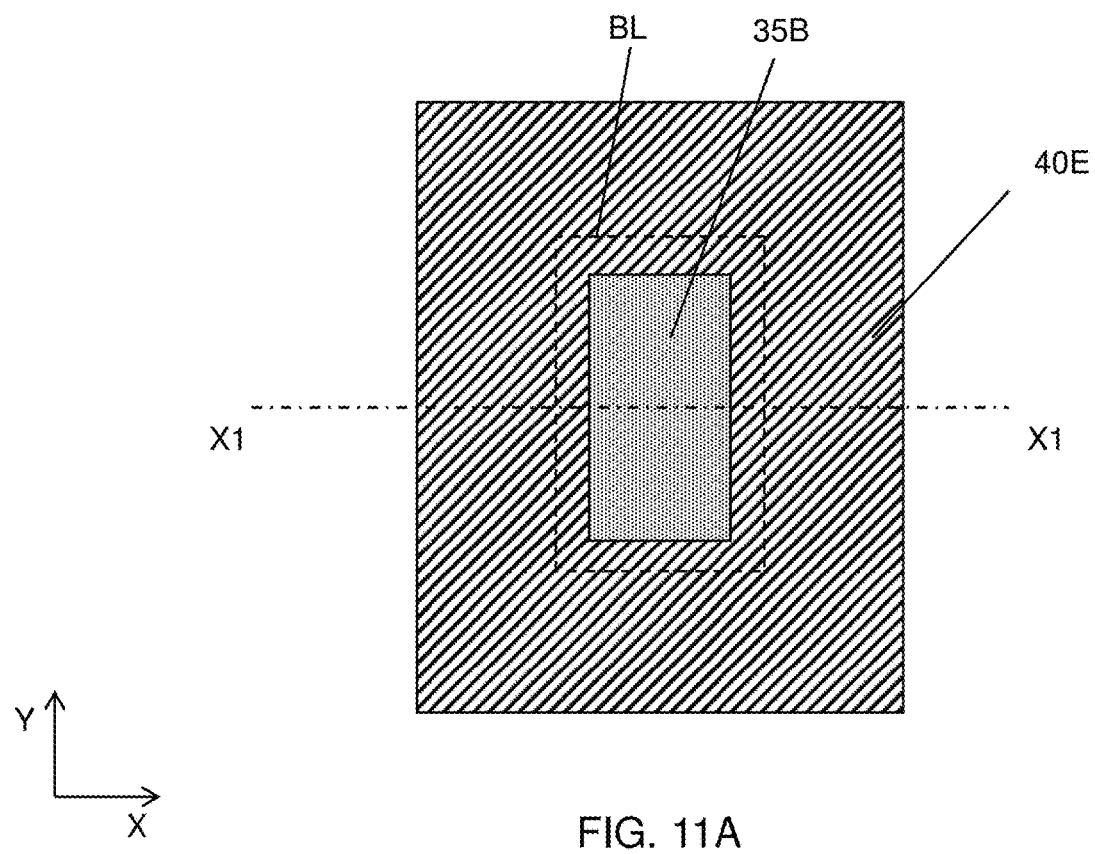
FIGS. 11A-12B show exemplary plan views and cross sectional views illustrating various stages of the sequential fabrication process of a semiconductor device according to another embodiment of the present disclosure.
Figure 11B:
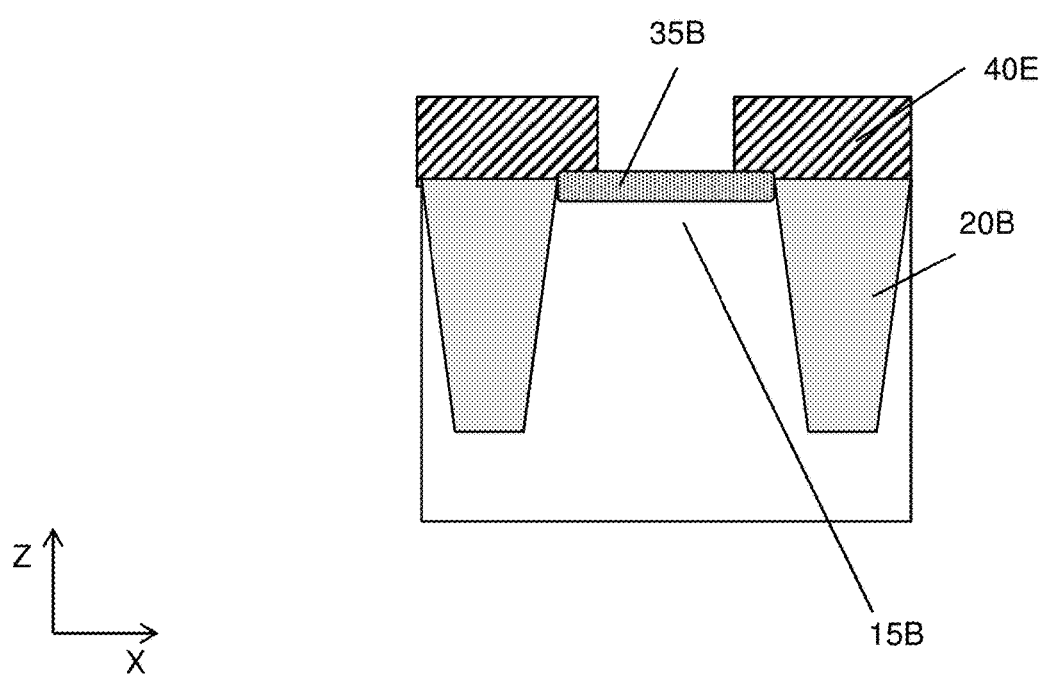

In FIGS. 3A and 3B, the second mask layer 40B is formed on only a part of a border line BL between the isolation region 20B and the second active region 15B. In this embodiment, the second mask layer 40E is formed to cover the entire border line BL, as shown in FIGS. 11A and 11B. Further, the second mask layer 40E covers the entire isolation region 20B. In other words, the mask layer 40E has an opening only over the second dielectric layer 35B in the second active region 15B, and the size of the opening is slightly smaller than the second active region 15B.

Figure 12A:
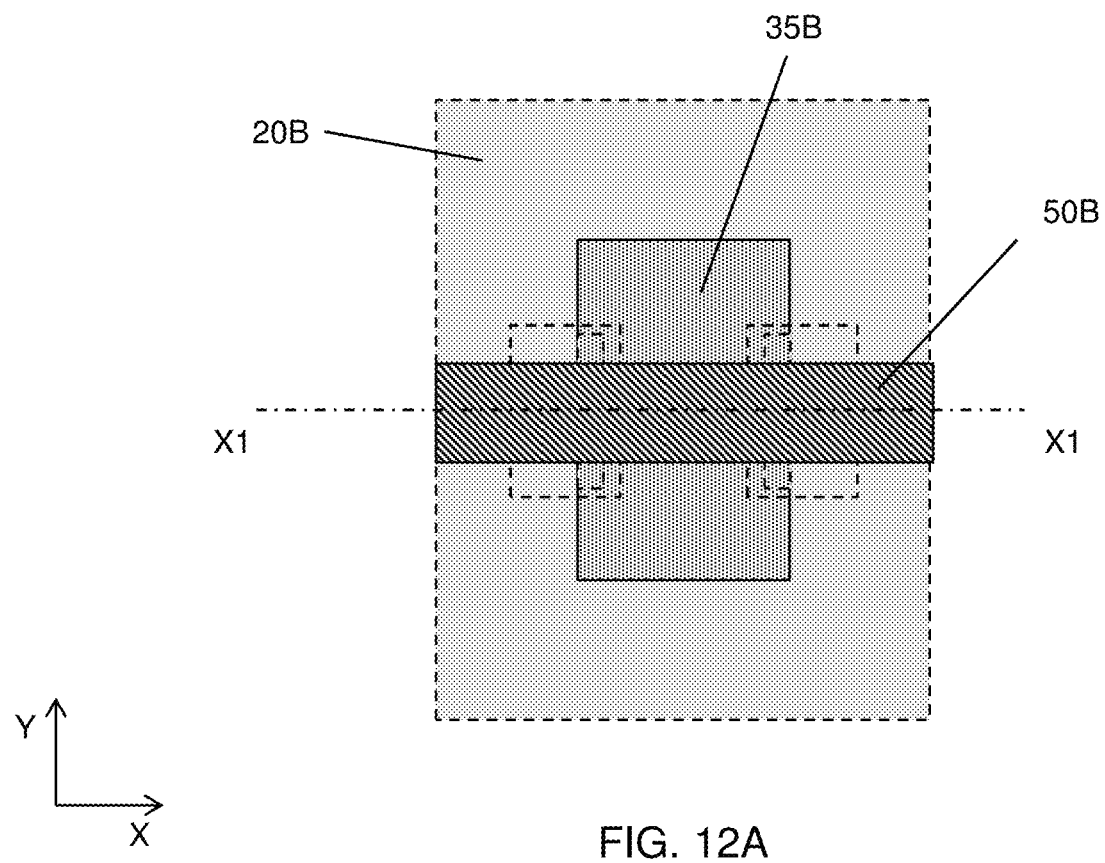
Figure 12B:
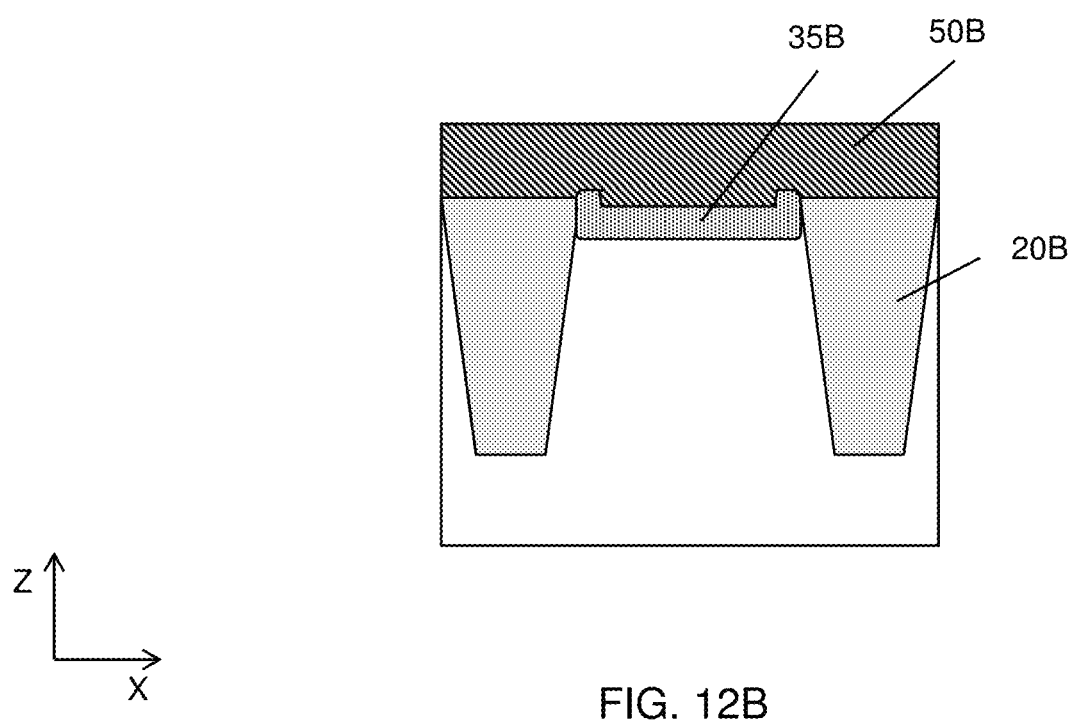

After the similar operations explained with respect to FIGS. 4A-7D, the second gate electrode 50B is formed over the second gate dielectric layer 35B, as shown in FIGS. 12A and 12B. With the second mask layer 40E of this embodiment, it is possible to eliminate any divot formed in the isolation region.

Figure 13A:
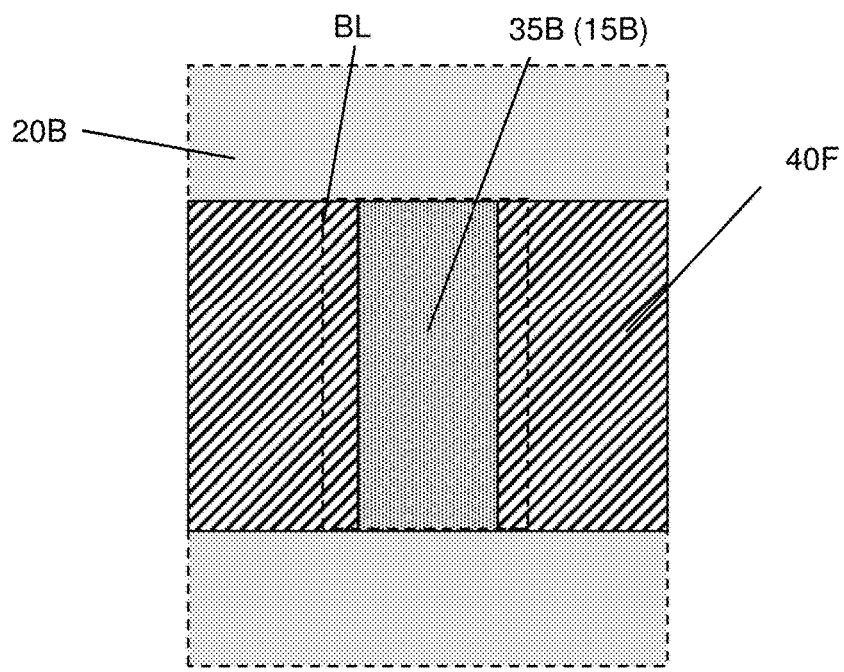
FIGS. 13A and 13B show exemplary plan views (viewed from the above) illustrating one of the various stages of the sequential fabrication process of a semiconductor device according to another embodiment of the present disclosure.
Figure 13B:
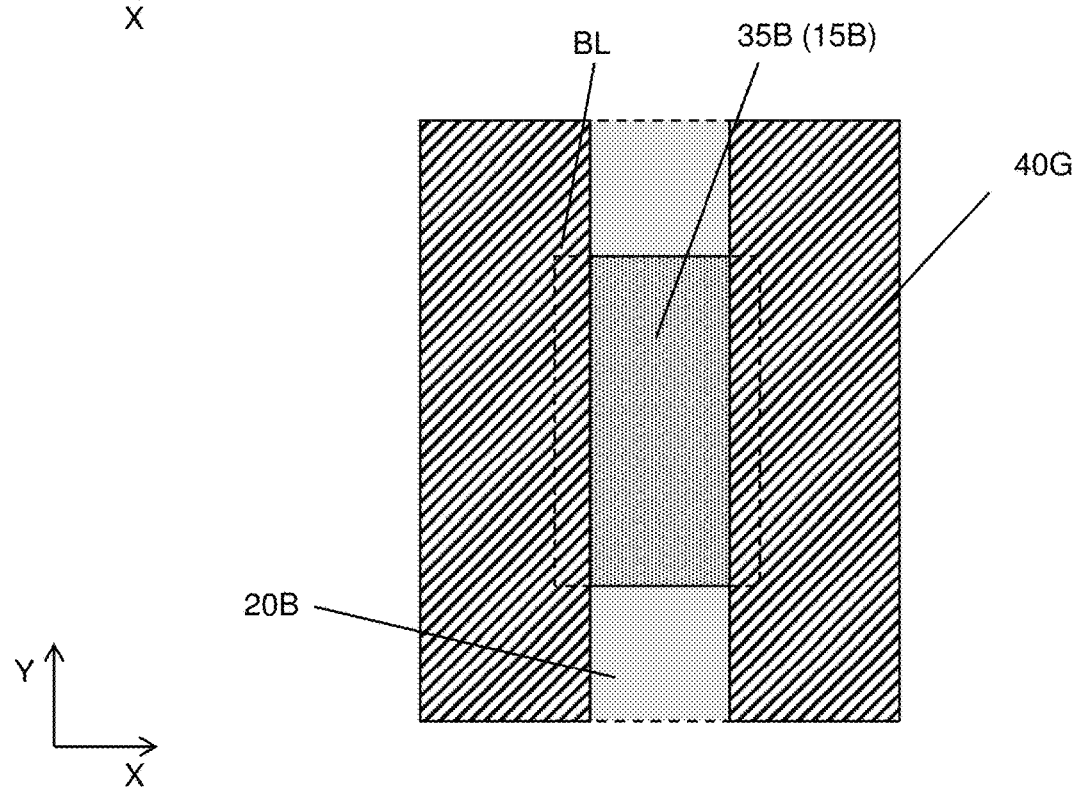

FIGS. 13A and 13B show exemplary plan views (viewed from the above) illustrating one of the various stages of the sequential fabrication process of a semiconductor device according to another embodiment of the present disclosure.

In FIG. 13A, the second mask layer 40F is formed to cover the entire border lines in Y direction. The length of the second mask layer 40F in the Y direction is substantially the same as the length of the active region 15B in the Y direction. With this mask layer 40F, the similar structure as shown in FIG. 12B can be obtained.

In FIG. 13B, the second mask layer 40G is formed to cover the entire border lines in Y direction, and the length of the second mask layer 40G in the Y direction is longer than the length of the active region 15B in the Y direction. With this mask layer 40G, the similar structure as shown in FIG. 12B can be obtained.

Figure 14:
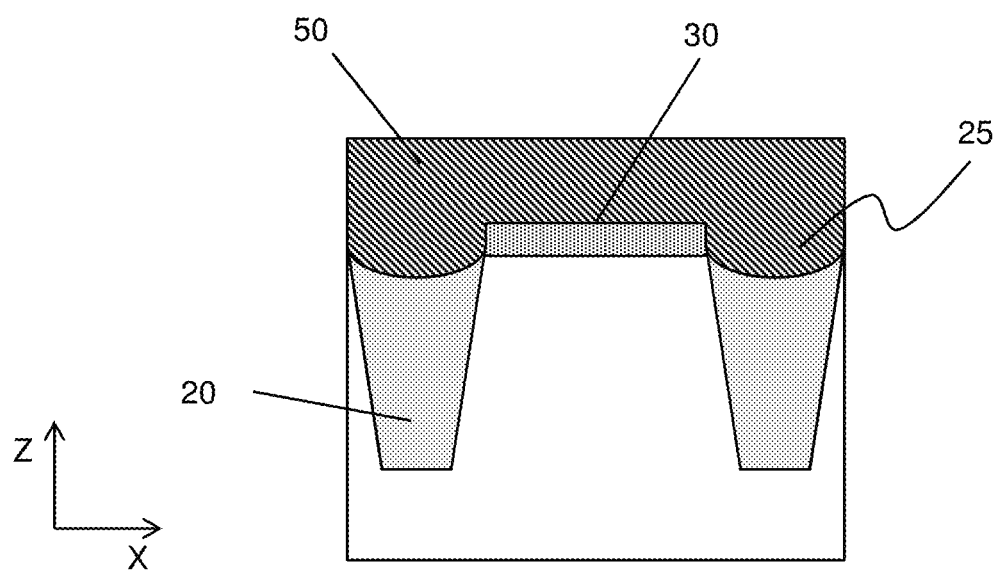
FIG. 14 shows an exemplary cross sectional view of a semiconductor device.

FIG. 14 shows a comparative example of an FET structure. Unlike the present embodiments, the second mask layer is not used in this example. If the second mask layers are not used and the portion of the isolation insulating layer surrounding the second active region 15B is also etched, the resultant FET has a structure shown in FIG. 14. In this case, the divot 25 filled with a material of the gate electrode 50 is formed in the isolation region 20 and is in contact with the gate dielectric layer 30 or is located very close to the gate dielectric layer 30. In such a case, a high electric field may be caused at around the active region and the gate electrode edge. As a result, a threshold voltage of corner devices near the isolation region may be decreased and may further lead to a double hump effect, which makes it difficult to determine a threshold voltage in curve fitting of a device simulation.

In contrast, as set forth above, in the present disclosure, in manufacturing an FET having relatively thinner gate dielectric layer, at least parts of the border line (and adjacent regions) along the Y direction (perpendicular to the X direction in which the second gate electrode extends) between the second isolation region 20B and the second active region 15B are covered by a second mask layer (40B and 40D-40G), and the first dielectric layer 35B exposed from the second mask layer is etched. Since at least a portion of the second isolation region adjacent to the border line BL is covered by the second mask layer, the portion of the second isolation region over which a second gate electrode is to be formed is not etched during the etching of the first dielectric layer 35B.

Accordingly, even if the second isolation region is etched to cause a divot, the location of the divot can be set away from the border line BL. Thus, it is possible to suppress a high electric field which would otherwise be caused at around the active region and the gate electrode edge, and to stabilize a threshold voltage of the FET across the semiconductor device. Moreover, it is possible to more precisely determine a threshold voltage in curve fitting of the device simulation.

It will be understood that not all advantages have been necessarily discussed herein, no particular advantage is required for all embodiments or examples, and other embodiments or examples may offer different advantages.

According to one aspect of the present disclosure, in a method of manufacturing a semiconductor device, an isolation region is formed in a substrate such that the isolation region surrounds an active region of the substrate in plan view. The isolation region includes an insulating material. A first dielectric layer is formed over the active region. A mask layer is formed on at least a part of a border line between the isolation region and the active region. The mask layer covers a part, but not entirety, of the first dielectric layer and a part of the isolation region surrounding the active region. The first dielectric layer not covered by the mask layer is removed such that a part of the active region is exposed. After the first dielectric layer is removed, the mask layer is removed. A second dielectric layer is formed so that a gate dielectric layer is formed. A gate electrode is formed over the gate dielectric layer.

According to another aspect of the present disclosure, in a method of manufacturing a semiconductor device including a first field effect transistor (FET) and a second FET, an isolation region is formed in a substrate such that the isolation region surrounds a first active region of the substrate for the first FET and a second active region of the substrate for the second FET in plan view. The isolation region includes an insulating material. A first dielectric layer is formed over the first and second active regions. A first mask layer is formed over the first active region to entirely cover the first active region and to cover a portion of the isolation region surrounding the first active region, and a second mask layer is formed on at least a part of a border line between the isolation region and the second active region, the second mask layer covering a part, but not entirety, of the first dielectric layer formed on the second active region and a part of the isolation region surrounding the second active region. The first dielectric layer formed on the second active region not covered by the second mask layer is removed such that a part of the second active region is exposed. The first and second mask layers are removed. After the first and second mask layers are removed, a second dielectric layer is formed so that a first gate dielectric layer for the first FET and a second gate dielectric layer for the second FET are formed. A first gate electrode is formed over the first gate dielectric layer for the first FET and a second gate electrode is formed over the second gate dielectric layer for the second FET.

In accordance with yet another aspect of the present disclosure, a semiconductor device includes an active region including a channel, a source and a drain, an isolation region surrounding the active region, a gate dielectric layer disposed on the channel, and a gate electrode disposed over the channel. The gate dielectric layer includes a first region and a second region having a thickness greater than the first region, and the second region is in contact with the isolation region.

The foregoing outlines features of several embodiments or examples so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments or examples introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of manufacturing a semiconductor device, the method comprising:
   forming an isolation region in a substrate such that the isolation region surrounds an active region of the substrate in plan view, the isolation region including an insulating material;
   forming a first dielectric layer over the active region;
   forming a mask layer on at least a part of a border line between the isolation region and the active region, the mask layer covering a part, but not entirety, of the first dielectric layer and a part of the isolation region surrounding the active region;
   removing the first dielectric layer not covered by the mask layer such that a part of the active region is exposed;
   after the first dielectric layer is removed, removing the mask layer;
   forming a second dielectric layer so that a gate dielectric layer is formed; and
   forming a gate electrode over the gate dielectric layer.

2. The method of claim 1, wherein the gate dielectric layer includes a first region and a second region having a thickness greater than the first region.

3. The method of claim 2, wherein the gate electrode is disposed over the first region and the second region.

4. The method of claim 2, wherein the second region is in contact with the border line.

5. The method of claim 1, wherein the removing the first dielectric layer is performed by wet etching.

6. The method of claim 5, wherein in the removing the first dielectric layer, a part of the isolation region is etched.

7. The method of claim 1, wherein the first and second dielectric layers are formed by thermal oxidation.

8. The method of claim 1, wherein an area of the mask layer that covers the isolation region is greater than an area of the mask layer that covers the first dielectric layer formed over the active region.

9. The method of claim 1, wherein the mask layer is made of photo resist.

10. The method of claim 1, wherein the mask layer covers an entirety of the border line.

11. A method of manufacturing a semiconductor device including a first field effect transistor (FET) and a second FET, the method comprising:
   forming an isolation region in a substrate such that the isolation region surrounds a first active region of the substrate for the first FET and a second active region of the substrate for the second FET in plan view, the isolation region including an insulating material;
   forming a first dielectric layer over the first and second active regions;
   forming a first mask layer over the first active region to entirely cover the first active region and to cover a portion of the isolation region surrounding the first active region, and a second mask layer on at least a part of a border line between the isolation region and the second active region, the second mask layer covering a part, but not entirety, of the first dielectric layer formed on the second active region and a part of the isolation region surrounding the second active region;
   removing the first dielectric layer formed on the second active region not covered by the second mask layer such that a part of the second active region is exposed;
   removing the first and second mask layers;

after the first and second mask layers are removed, forming a second dielectric layer so that a first gate dielectric layer for the first FET and a second gate dielectric layer for the second FET are formed; and forming a first gate electrode over the first gate dielectric layer for the first FET and a second gate electrode over the second gate dielectric layer for the second FET.

12. The method of claim 11, wherein the second gate dielectric layer includes a first region and a second region having a thickness greater than the first region.

13. The method of claim 12, wherein the second gate electrode is disposed over the first region and the second region.

14. The method of claim 12, wherein the second region is in contact with the border line.

15. The method of claim 11, wherein the removing the first dielectric layer is performed by wet etching.

16. The method of claim 15, wherein in the removing the first dielectric layer, a part of the isolation region surrounding the second active region is etched.

17. The method of claim 11, wherein the first and second dielectric layers are formed by thermal oxidation.

18. The method of claim 11, wherein an area of the second mask layer that covers the isolation region is greater than an area of the second mask layer that covers the first dielectric layer formed over the second active region.

19. The method of claim 11, wherein the second mask layer covers an entirety of the border line.

20. A semiconductor device comprising:
an active region including a channel, a source and a drain;
an isolation region surrounding the active region;
a gate dielectric layer disposed on the channel; and
a gate electrode disposed over the channel, wherein:
the gate dielectric layer includes a first region and a second region having a thickness greater than the first region,
the second region is in contact with the isolation region,
the isolation region includes a first portion in contact with the gate dielectric layer and a second portion away separated from the gate dielectric layer by the first portion,
the second side portion includes a recess, and
a part of the gate electrode is embedded in the recess.

* * * * *